(12) United States Patent
Ikuta

(10) Patent No.: US 8,241,821 B2
(45) Date of Patent: Aug. 14, 2012

(54) REFLECTIVE MASK BLANK FOR EUV LITHOGRAPHY, PROCESS FOR PRODUCING THE SAME AND MASK FOR EUV LITHOGRAPHY

(75) Inventor: Yoshiaki Ikuta, Tokyo (JP)

(73) Assignee: Asahi Glass Company, Limited, Tokyo (JP)

( * ) Notice: Subject to any disclaimer, the term of this patent is extended or adjusted under 35 U.S.C. 154(b) by 0 days.

(21) Appl. No.: 13/038,429

(22) Filed: Mar. 2, 2011

(65) Prior Publication Data

US 2011/0165504 A1    Jul. 7, 2011

Related U.S. Application Data

(63) Continuation of application No. PCT/JP2009/065360, filed on Sep. 2, 2009.

(30) Foreign Application Priority Data

Sep. 5, 2008   (JP) ................................. 2008-227909

(51) Int. Cl.
*G03F 1/24* (2012.01)
(52) U.S. Cl. ........................................................... 430/5
(58) Field of Classification Search .............. 430/5, 311, 430/312, 313, 394; 378/35; 428/428, 430
See application file for complete search history.

(56) References Cited

U.S. PATENT DOCUMENTS

| 7,678,511 B2 | 3/2010 | Ikuta et al. | |
| 7,713,665 B2 * | 5/2010 | Mickan et al. | 430/5 |
| 2003/0013216 A1 * | 1/2003 | Rau | 438/22 |
| 2004/0188383 A1 * | 9/2004 | Lucas et al. | 216/54 |
| 2007/0087578 A1 | 4/2007 | Sugiyama et al. | |
| 2010/0167187 A1 | 7/2010 | Ikuta et al. | |

FOREIGN PATENT DOCUMENTS

EP    1 598 890    11/2005
(Continued)

OTHER PUBLICATIONS

International Search Report issued Oct. 6, 2009 in PCT/JP09/065360 filed Sep. 16, 2009.

*Primary Examiner* — Stephen Rosasco
(74) *Attorney, Agent, or Firm* — Oblon, Spivak, McClelland, Maier & Neustadt, L.L.P.

(57) ABSTRACT

Provision of an EUV mask whereby influence of EUV reflected light from an absorber film surface in the peripheral portion of a mask pattern region is suppressed at a time of carrying out EUV lithography; an EUV mask blank to be employed for producing the above EUV mask; and a process for producing the EUV mask blank. A process for producing a reflective mask blank for EUV lithography (EUVL), comprising alternately laminating a high refractive index film and a low refractive index film on a substrate to form a multilayer reflective film for reflecting EUV light and forming an absorber layer for absorbing EUV light on the multilayer reflective film, wherein the process further comprises after formation of the above multilayer reflective film, heating a portion of a surface of the multilayer reflective film outside a portion to be a mask pattern region in a reflective mask for EUV lithography produced by employing the reflective mask blank for EUV, to reduce the reflectivity of the heated portion of the surface of the multilayer reflective film for EUV light.

24 Claims, 3 Drawing Sheets

FOREIGN PATENT DOCUMENTS

| | | |
|---|---|---|
| JP | 2003-273013 | 9/2003 |
| JP | 2005-098903 | 4/2005 |
| JP | 2006-47809 | 2/2006 |
| JP | 2006-93454 | 4/2006 |
| JP | 2006-228766 | 8/2006 |
| JP | 2007-109971 | 4/2007 |
| JP | 2007-183120 | 7/2007 |
| JP | 2008-016821 | 1/2008 |
| JP | 2008-041740 | 2/2008 |

\* cited by examiner

REFLECTIVE MASK BLANK FOR EUV LITHOGRAPHY, PROCESS FOR PRODUCING THE SAME AND MASK FOR EUV LITHOGRAPHY

TECHNICAL FIELD

The present invention relates to a reflective mask blank for EUV (Extreme Ultra Violet) lithography (in this specification, hereinafter referred to as "EUV mask blank") to be used for e.g. production of semiconductors, a process for producing such an EUV mask blank and a reflective mask for EUV lithography (in this specification, hereinafter referred to as "EUV mask") obtained by forming a mask pattern in an absorber film of such an EUV mask blank.

BACKGROUND ART

In the semiconductor industry, a photolithography method using visible light or ultraviolet light has been employed as a technique for transferring, on a Si substrate or the like, a fine pattern, which is required for forming an integrated circuit comprising such a fine pattern. However, the conventional photolithography method has been close to the resolution limit, while microsizing of semiconductor devices has been accelerated. In the case of the photolithography method, it is said that the resolution limit of a pattern is about ½ of an exposure wavelength, and that even if an immersion method is employed, the resolution limit is about ¼ of an exposure wavelength. Even if an immersion method using an ArF laser (193 nm) is employed, it is estimated that the resolution limit is about 45 nm. From this point of view, EUV lithography, which is an exposure technique using EUV light having a shorter wavelength than ArF laser, is considered to be promising as an exposure technique for 45 nm or below. In this specification, "EUV light" means a ray having a wavelength in a soft X-ray region or a vacuum ultraviolet ray region, specifically a ray having a wavelength of from about 10 to 20 nm, in particular, of about 13.5 nm±0.3 nm.

EUV light is apt to be absorbed by any substances and the refractive indices of substances are close to 1 at this wavelength, whereby it is impossible to use a dioptric system like a conventional photolithography employing visible light or ultraviolet light. For this reason, for EUV light lithography, a catoptric system, i.e. a combination of a reflective photomask (hereinafter referred to as EUV mask) and mirrors, is employed.

A mask blank is a film-laminated plate for a photomask, which has not been patterned yet. In the case of an EUV mask blank, it has a structure wherein a reflective film for reflecting EUV light and an absorber film for absorbing EUV light, are formed in this order on a substrate made of glass or the like (Patent Document 1). Besides these films, in such an EUV mask blank, a protection film for protecting the reflective film at a time of forming a mask pattern in the absorber film, is usually formed between the reflective film and the absorber film. Further, on the absorber film, an antireflective film is usually formed for improving the optical contrast at a time of inspecting a mask pattern.

In such an EUV mask blank, the thickness of the absorber film is preferably thin. In EUV lithography, exposure light is not incident from a perpendicular direction to an EUV mask but incident from a direction at an angle of a few degrees, usually 6 degrees, to the perpendicular direction. If the thickness of the absorber film is thick, at a time of EUV lithography, a shadow of the exposure light is formed on a mask pattern formed by removing a part of the absorber film by etching, and the pattern accuracy or the dimension accuracy of a mask pattern (hereinafter referred to as "transfer pattern") transferred to a resist on a substrate such as a Si wafer by using the EUV mask, tends to be deteriorated. Since this problem becomes more significant as the line width of the mask pattern formed on the EUV mask becomes smaller, the thickness of the absorber film of the EUV mask blank is required to be thinner. However, in order to maintain absorptivity of EUV light, the absorber film needs to have a certain thickness.

For the absorber film of the EUV mask blank, a material having a high absorption coefficient for EUV light is employed, and the thickness is ideally a thickness whereby EUV light incident into a surface of the absorber film is completely absorbed. However, as described above, since the thickness of the absorber film is required to be thin, it is not possible for the absorber film to completely absorb EUV light incident into the layer, and a part of the incident light will be reflected from the layer.

The step of forming a transfer pattern of a resist on a substrate by EUV lithography requires the optical contrast of reflected light from the EUV mask, that is, the contrast between reflected light from a portion of the mask wherein the absorber film is removed at a time of forming the mask pattern so that the reflective film is exposed to the outside, and reflected light from a portion of the mask wherein the absorber film is not removed at the time of forming the mask pattern. Accordingly, it has been considered that so long as a sufficient optical contrast of reflected light is obtained, there is no problem even if the incident EUV light is not completely absorbed by the absorber film.

Based on the above concept, in order to reduce the thickness of the absorber film, an EUV mask using the principle of phase shift is proposed (refer to Patent Document 2). This has a characteristics that a portion from which the absorber film is not removed at a time of forming a mask pattern has a reflectivity of from 5 to 15% for EUV light (reflected light), and that EUV reflected light from such a portion has a phase difference of 175 to 185° from EUV reflected light from a portion where the absorber film is removed at the time of forming the mask pattern so that the reflective film is exposed to the outside. The document describes that with the EUV mask, by using the principle of phase shift for reflected light from the absorber film, it is possible to maintain a sufficient optical contrast to the reflective film, and accordingly, it is possible to reduce the thickness of the absorber film.

PRIOR ART

Patent Documents

Patent Document 1: US2007-0087578
Patent Document 2: JP-A-2006-228766

DISCLOSURE OF THE INVENTION

Problems to be solved by the Invention

However, the present inventors have discovered that the above principle and the film constructions have no problem for a real mask pattern region (a region wherein a mask pattern is formed, which is used for pattern-transferring at a time of EUV lithography), but the structures have a problem for peripheral portions of the pattern region. This point will be described with reference to FIG. 5.

FIG. 5 is a schematic cross-sectional view showing an example of EUV mask after a pattern is formed, wherein a reflective film 130 and an absorber film 140 are formed in this order on a substrate 120, and in a mask pattern region 210, a mask pattern formed by partially removing the absorber film 140, is present. In the mask pattern region 210 of an EUV mask 100 shown in FIG. 5, by the above principle of phase shift, a sufficient optical contrast between a reflected light from a surface of the reflective film 120 and a reflected light from a surface of the absorber film 130 can be maintained. However, the real exposure region, that is, the region in which EUV light is really radiated, is a real exposure region 200. Accordingly, EUV light is incident into also a region 220 outside the mask pattern region 210 (peripheral region of mask pattern region). At this time, since the effect of phase shift with reflected light from the reflective film 130 is not sufficiently obtained, reflection of from about 5 to 15% from a surface of the absorber film 140 occurs. As a result, this about 5 to 15% of EUV light is incident into a resist on a Si substrate, and there may occur a problem of unnecessary exposure of resist. Particularly, at a time of carrying out an overlay exposure, this problem becomes significant.

In order to solve the above problems of conventional technique, it is an object of the present invention to provide an EUV mask whereby an influence of reflected light from a peripheral portion of a mask pattern region is suppressed at a time of carrying out EUV lithography, an EUV mask blank to be used for producing such an EUV mask, and a process for producing such an EUV mask blank.

Means for Solving the Problems

In order to solve the above problems, the present invention provides a process for producing a reflective mask blank for EUV lithography (EUVL) (process (1) for producing an EUV mask of the present invention), comprising alternately laminating a high refractive index film and a low refractive index film on a substrate to form a multilayer reflective film for reflecting EUV light and forming an absorber layer for absorbing EUV light on the multilayer reflective film, wherein the process further comprises after formation of the above multilayer reflective film, heating a portion of a surface of the multilayer reflective film outside a portion to be a mask pattern region in a reflective mask for EUV lithography produced by employing the reflective mask blank for EUV, to reduce the reflectivity of the heated portion of the surface of the multilayer reflective film for EUV light.

In the process (1) for producing an EUV mask of the present invention, it is preferred that the difference of the reflectivity of the heated portion of the surface of the multilayer reflective film for EUV light between before and after the heating is from 10 to 60%.

In the process (1) for producing an EUV mask of the present invention, it is preferred that the reflectivity for EUV light before the heating is at least 60%.

Further, the present invention provides a process for producing a reflective mask blank for EUV lithography (EUVL) (process (2) for producing an EUV mask of the present invention), comprising alternately laminating on a substrate at least a high refractive index film and a low refractive index film to form a multilayer reflective film reflecting EUV light, forming a protection film on the multilayer reflective film, and forming an absorber film for absorbing EUV light on the protection film, wherein the process further comprises after formation of the protection film a step of heating a portion of the protection film outside a portion to be a mask pattern region in a reflective mask for EUV lithography produced by employing the reflective mask blank for EUVL, to reduce the reflectivity of the heated portion of the surface of the protection film for EUV light.

In the process (2) for producing an EUV mask of the present invention, it is preferred that the difference of the reflectivity of the heated portion of the surface of the protection film for EUV light between before and after the heating is from 10 to 60%.

In the process (2) for producing an EUV mask of the present invention, it is preferred that the reflectivity for EUV light before heating is at least 60%.

In the processes (1) and (2) for producing an EUV mask of the present invention, it is preferred that the heating is carried out under the condition satisfying the following formula:

Reflectivity (%) for EUV light before heating−9370×heating time (min)×exp(−4370/heating temperature (K))≦1%

In the processes (1) and (2) for producing an EUV mask of the present invention, it is preferred that the process employs radiation of a light beam or an electron beam for the heating.

In the processes (1) and (2) for producing an EUV mask of the present invention, it is preferred that the process employs an exothermic member for the heating.

In the processes (1) and (2) for producing an EUV mask of the present invention, it is preferred that the process employs blowing of a preliminarily heated gas for the heating.

In the processes (1) and (2) for producing an EUV mask of the present invention, it is preferred that the process further comprises a step of forming on the absorber film an antireflective film for improving the optical contrast at a time of inspecting a mask pattern.

Further, the present invention provides a reflective mask blank for EUVL (EUV mask blank of the present invention) produced by the process (1) or (2) for producing an EUV mask of the present invention.

In the EUV mask produced by the process (1) for producing an EUV mask of the present invention, it is preferred that the phase of EUV reflected light from a surface of the absorber film is different from the phase of EUV reflected light from a surface of the multilayer reflective film by from 175 to 185°.

In the EUV mask blank produced by the process (2) for producing an EUV mask of the present invention, it is preferred that the phase of EUV reflected light from a surface of the absorber film is different from the phase of EUV reflected light from a surface of the protection film by from 175 to 185°.

In the EUV mask blank of the present invention, it is preferred that the reflectivity of a portion of a surface of the absorber film outside a portion to be a mask pattern region in a reflective mask for EUV lithography to be produced by employing the reflective mask blank for EUVL, for EUV light is at most 1%, and the reflectivity of a portion to be a mask pattern region for EUV light is more than 1% and at most 15%.

Further, the present invention provides a reflective mask (EUV mask of the present invention) for EUV lithography (EUVL) produced by forming a mask pattern in the absorber film of the EUV mask blank of the present invention.

Further, the present invention provides a process for producing a semiconductor integrated circuit comprising carrying out an exposure to an object to be exposed by using the EUV mask of the present invention.

Effects of the Invention

When EUV lithography is carried out by using the EUV mask of the present invention, the reflectivity of a surface of the absorber film (a surface of a low reflective film when the low reflective film is formed on the absorber film) in a region (peripheral portion of the mask pattern region) outside the mask pattern region for EUV light decreases.

Accordingly, influence of EUV reflected light from a surface of the absorber film in a region (peripheral portion of the mask pattern region) outside the mask pattern region, that is, unnecessary exposure of a resist on the substrate due to the EUV reflected light from a surface of the absorber film in a region (peripheral portion of the mask pattern region) outside the mask pattern region, can be suppressed.

In the mask pattern region, the thickness of the absorber film can be reduced by using the principle of phase shift, miniaturization of a pattern is possible, and a transfer pattern formed in the resist on the substrate by using the EUV mask is excellent in the shape accuracy and the dimension accuracy.

In the EUV mask blank of the present invention, since the reflectivity of a portion outside a portion to be a mask pattern region in an EUV mask to be produced by employing the EUV mask blank, for EUV light is decreased, the EUV mask blank is suitable for obtaining the EUV mask of the present invention.

The EUV mask blank of the present invention can be obtained by the process for producing an EUV mask blank of the present invention, and the EUV mask blank is applicable to an EUV lithography process.

MODE FOR CARRYING OUT THE INVENTION

Figure 1:
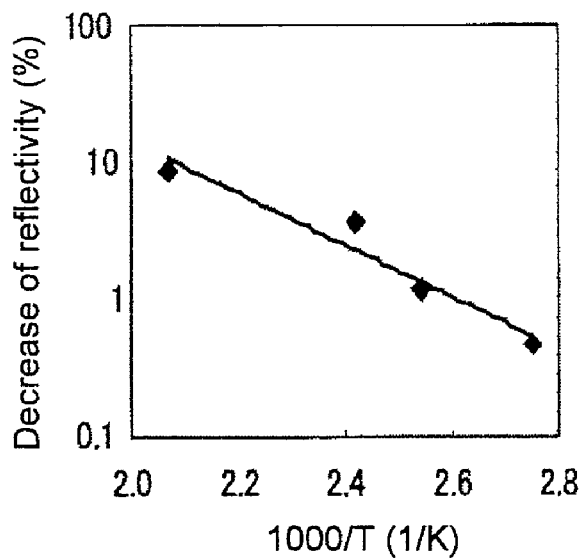
FIG. 1 is a graph showing decrease of the reflectivity for EUV light in relation to the heating temperature when a substrate with a multilayer reflective film (Mo/Si multilayer reflective film) and a protection film (Si film, Ru film) is heated for 10 minutes in the atmospheric air by using a hotplate.

Now, a process for producing an EUV mask blank of the present invention will be described.

The process for producing an EUV mask blank of the present invention will be shown below in sequence.

(1) Prepare a substrate.
(2) Form on the substrate a multilayer reflective film for reflecting EUV light.
(3) Heat a portion of a surface of the multilayer reflective film outside a portion to be a mask pattern region in an EUV mask to be produced by employing the EUV mask blank.
(4) Form an absorber film on the multilayer reflective film.

Here, in order to stably maintain the characteristics required for the multilayer reflective film for a long time, a step (5) of forming a protection film on the multilayer reflective film may be added between the above step (2) and above step (3). In this case, in the above step (3), the heating is applied not to a surface of the multilayer reflective film but to a portion of a surface of the protection film outside a portion to be a mask pattern region in an EUV mask to be produced by employing the EUV mask blank.

Further, a step (6) of forming on the multilayer reflective film or on the protection film a buffer film playing a role of an etching stopper at a time of patterning the absorber film by an etching process to form a mask pattern, may be added between the above step (3) and the above step (4).

Further, a step (7) of forming on the absorber film an antireflective film for improving the optical contrast at a time of inspecting a mask pattern to make the inspection of mask pattern possible, may be added after the above step (4).

Further, as described in detail later, the above step (3) may be carried out after the above step (4) or the step (7) depending on the type of heating means.

Further, a cleaning step may be added between the steps to remove particles added to a film surface in each step or contaminants absorbed to a film surface in each step.

In the following, the detail of each step will be described in sequence.

[Substrate]

A substrate is required to satisfy characteristics of a substrate for EUV mask blank. Accordingly, the substrate preferably has, at a temperature at a time of exposure, a low thermal expansion coefficient (preferably $0\pm1.0\times10^{-7}/°C.$, more preferably $0\pm0.3\times10^{-7}/°C.$, further preferably $0\pm0.2\times10^{-7}/°C.$, further preferably $0\pm0.1\times10^{-7}/°C.$, particularly preferably $0\pm0.05\times10^{-7}/°C.$), and the substrate is preferably excellent in the smoothness, the flatness and the durability against a cleaning fluid to be used for cleaning of the EUV mask blank or an EUV mask after formation of a mask pattern. As the substrate, specifically, a glass having a low thermal expansion coefficient, such as a $SiO_2$—$TiO_2$ type glass is employed. However, the substrate is not limited thereto, and a substrate of crystallized glass produced by separating a β quartz solid solution, a quartz glass, silicon or a metal may also be employed. Further, a film such as a stress compensation film may be formed on the substrate.

The substrate preferably has a smooth surface of at most 0.15 nm rms, preferably at most 0.1 nm rms and a flatness of preferably at most 70 nm, for the purpose of obtaining a high reflectivity and a high transfer accuracy in an EUV mask to be produced.

The size or the thickness, etc. of the substrate is appropriately determined depending on the design values of EUV mask to be produced. For example, the external shape is 6 inch (152.4 mm) square and the thickness is 0.25 inch (6.35 mm).

It is preferred that no defect is present on a surface of the substrate on which a multilayer reflective film is to be formed (film-forming plane). However, even if the defects are present, in order to avoid formation of phase defects due to concave defects and/or convex defects, the depth of such concave defects and the height of such convex defects are at most 2 nm, preferably at most 1.5 nm, and the FWHM (full width of half maximum) is at most 60 nm, preferably at most 40 nm.

[Multilayer Reflective Film]

As the reflective film of a mask blank for EUVL, at least a multilayer reflective film being a lamination of alternately laminated plurality of high refractive index films and low refractive index films is employed for the purpose of achieving a high reflectivity for EUV light. Here, the reflectivity for EUV light means the reflectivity for EUV light in a wavelength region of from 12 to 15 nm when a light beam in the wavelength region of EUV light is incident at an incident angle of from 6 to 10°.

The maximum value of the reflectivity of a surface of the multilayer reflective film for EUV light is preferably at least 60%, more preferably at least 65%.

In the multilayer reflective film, Si (the refractive index is 0.999 at wavelength 13.5 nm) is widely employed for the high refractive index film, and Mo (refractive index is 0.924 at the same wavelength) is widely used for the low refractive index film. Namely, a Mo/Si multilayer reflective film is the most common. However, the multilayer reflective film is not limited thereto, and it may be a Ru/Si multilayer reflective film, a Mo/Be multilayer reflective film, a Rh/Si multilayer reflective film, a Pt/Si multilayer reflective film, a Mo compound/Si compound multilayer reflective film, a Si/Mo/Ru multilayer reflective film, a Si/Mo/Ru/Mo multilayer reflective film or a Si/Ru/Mo/Ru multilayer reflective film. The multilayer reflective film is preferably a Mo/Si multilayer reflective film from the viewpoint of stability and easiness of production. Further, such a Mo/Si multilayer reflective film is suitable for local heating process to be described later.

The film thickness of each layer and the number of repeating units of the layers constituting the multilayer reflective film, can be appropriately selected according to the film material to be used and the EUV light reflectivity required to the reflective layer. In a case of Mo/Si multilayer reflective film, a reflective layer having a maximum value of the reflectivity for EUV light of at least 60% can be obtained by forming a multilayer reflective film wherein a Mo layer having a thickness of 2.3±0.1 nm and a Si layer having a thickness of 4.5±0.1 nm are alternately laminated so that the number of repeating units becomes from 30 to 60.

Here, layers constituting the multilayer reflective film may be each formed by a known film-forming method such as a magnetron sputtering method or an ion beam sputtering method so as to have a desired thickness.

For example, in a case of forming a Mo/Si multilayer reflective film by using an ion beam sputtering method, the film is preferably formed by forming a Si film by using a Si target as a target and Ar gas (gas pressure $1.3 \times 10^{-2}$ to $2.7 \times 10^{-2}$ Pa, preferably $1.5 \times 10^{-2}$ to $2 \times 10^{-2}$ Pa) as a sputtering gas under an ion acceleration voltage of from 300 to 1,500 V, preferably from 500 to 1,200 V at a film-forming speed of from 0.03 to 0.30 nm/sec, preferably from 0.05 to 0.2 nm/sec so as to have a thickness of 4.5 nm, and subsequently forming a Mo film by using a Mo target as a target and Ar gas (gas pressure $1.3 \times 10^{-2}$ to $2.7 \times 10^{-2}$ Pa, preferably $1.5 \times 10^{-2}$ to $2.5 \times 10^{-2}$ Pa) as a sputtering gas under an ion acceleration voltage of from 300 to 1,500 V, preferably from 500 to 1,200 V at a film-forming speed of from 0.03 to 0.30 nm/sec, preferably from 0.05 to 0.2 nm/sec so as to have a thickness of 2.3 nm. Using the above process as one cycle, from 40 to 50 cycles of Si film and Mo film are laminated to form a Mo/Si multilayer reflective film.

[Protection Film]

In order to prevent a surface of the multilayer reflective film and its vicinity from being naturally oxidized at a time of a storage or being oxidized at a time of cleaning, a protection film may be provided on the multilayer reflective film. The material of the protection film may be Si, Ru, Rh, C, SiC, a mixture of these elements or any of these elements mixed with e.g. nitrogen or boron. Ru is particularly preferred as the material of protection film since the protection film made of Ru has also a function of buffer film to be described later.

Further, when the multilayer reflective film is constituted by Mo/Si, by providing a Si film as the uppermost layer, it is possible to make the uppermost layer function as a protection film. In this case, the thickness of the Si film being the uppermost layer functioning also as a protection film is preferably from 5 to 15 nm that is thicker than the normal thickness 4.5 nm. Further, when a Si film is formed as a protection film, a Ru film functioning both as a protection film and a buffer film may be formed on the Si film.

Here, the number of a film such as the multilayer reflective film or the protection film is not necessarily one but it may be two or more.

When a protection film is formed on the multilayer reflective film, the maximum value of the reflectivity of a surface of the protection film for EUV light needs to satisfy the above range. Namely, the maximum value of the reflectivity of a surface of the protection film for EUV light is preferably at least 60%, more preferably at least 65%.

[Heating of Multilayer Reflective Film (Protection Film)]

The present inventors have discovered that when a multilayer reflective film or a protection film is heated, the reflectivity of a surface of each of these films for EUV light decreases.

Specifically, it is considered that when the multilayer reflective film is heated, the high refractive index material and the low refractive index material forming the multilayer reflective film diffuse into each other and reacts with each other to form a diffusion layer, which decreases the reflectivity for EUV light.

It is considered that when the protection film is heated, a material forming a surface layer of the multilayer reflective film and a material forming the protection film diffuse into each other and react with each other to form a diffusion layer, and/or the high refractive index material and the low refractive index material forming the multilayer reflective film present underneath the protection film diffuse into each other and react with each other to form a diffusion layer, to reduce the reflectivity for EUV light. In order to form such a diffusion layer, the film thickness of the protection film is preferably from 1 to 15 nm, particularly preferably from 5 to 15 nm.

FIG. 1 shows the decrease of reflectivity for EUV light in relation to the heating temperature when a Si film (film thickness 4.5 nm) and a Mo film (film thickness 2.3 nm) are alternately laminated on a substrate (made of $SiO_2$—$TiO_2$ type glass) so that the total number of Si films and Mo films become 40 to form a multilayer reflective film, and a Si film (film thickness 4.5 nm) is formed on the multilayer reflective film as a protection film, and subsequently, a Ru film (film thickness 2.5 nm) functioning both as a protection film and a buffer film is formed on the Si film to form a substrate with multilayer reflective film and protection film, and the substrate is multilayer reflective film and protection film is heated in the atmospheric air for 10 minutes by using a hotplate. Here, since such a hotplate heats the entire substrate with films, the reflectivity of the entire surface decreases. However, a light beam or local heating causes heating of only a part of the substrate with films, whereby the reflectivity of a part of such substrate decreases. However, the decrease of the reflectivity is considered to be the same between hotplate heating and light beam heating.

In FIG. 1, the vertical axis represents the decrease of reflectivity for EUV light ($\Delta R$ (decrease (%) of reflectivity by heating)/R (reflectivity (%) before heating)×100)) (%), and the horizontal axis represents 1000/T (heating temperature) (1/K). Here, the reflectivity for EUV light in FIG. 1 is the maximum value of the reflectivity for EUV light within a wavelength range of from 12 to 15 nm. The maximum value of the reflectivity for EUV light means a value of the highest reflectivity in the reflectivities of various measurement points on a surface of a film to be measured.

Since the multilayer reflective film is a type of Bragg reflective mirror, the decrease of the reflectivity for EUV light is considered to depend on the thickness of a diffusion layer formed. The results of FIG. 1 indicates that the decrease of the reflectivity for EUV light substantially linearly depends on the thickness of a diffusion layer formed, and its dependence on heating temperature is determined according to Arrhenius equation regarding to the temperature dependence of common reaction speed. Further, since the thickness of the diffusion layer increases linearly according to the reaction time (=heating time), the heating temperature dependence and the heating time dependence of the decrease of the reflectivity for EUV light is determined according to the following formula (1). Here, in the Example shown in FIG. 1, formula (1) is converted to formula (2).

Decrease of reflectivity∝thickness of diffusion layer∝heating time×exp($a+b$/heating temperature (K))   Formula (1)

(Here, a and b are each a constant.)

Decrease of reflectivity (%)=9130×heating time (min)×exp(−4370/heating temperature (K))   Formula (2)

Table 1 organizes and shows the temperature dependence of the decrease of reflectivity for EUV light by heating obtained from FIG. 1.

TABLE 1

| Temperature (° C.) | Decrease of reflectivity (%) |
|---|---|
| 110 | 1.01 |
| 130 | 1.77 |
| 150 | 2.96 |
| 170 | 4.72 |
| 190 | 7.23 |

As apparent from FIG. 1 and Table 1, by heating the multilayer reflective film or the protection film, it is possible to decrease the reflectivity of a surface of each of these films for EUV light. In the process for producing an EUV mask blank of the present invention, according to this knowledge, on a surface of multilayer reflective film (a surface of protection film when the protection film is formed on the multilayer reflective film), a portion of the surface outside a portion to be a mask pattern region in an EUV mask to be produced by employing the EUV mask blank (a portion to be a peripheral portion of the mask pattern region) is heated. This procedure will be described with reference to drawings. In the following, explanation will be made with reference to a case of heating a surface of the multilayer reflective film, but in a case where a protection film is formed on the multilayer reflective film, in the following explanation, the term multilayer reflective film is construed as protection film.

Figure 6:
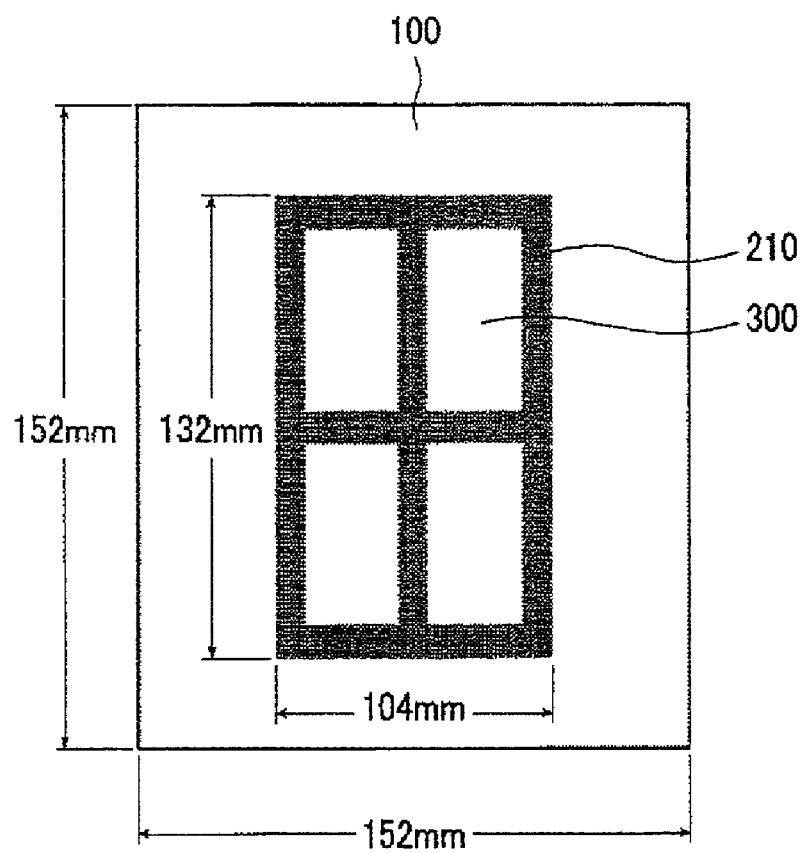
FIG. 6 is a plan view showing an example of an EUV mask after a mask pattern is formed.

Further, as shown in FIG. 6, in an EUV mask 100 having a size of 152 mm×152 mm square, a region 210 in which a mask pattern is to be formed is usually a region of 104×132 mm that is the same as the image field of EUV exposure apparatus. About from one to nine mask patterns 300 are formed in this region to form from one to nine devices in the image field of the exposure apparatus. In such a case, a border region between adjacent devices (mask patterns) 300 and a portion to be a peripheral portion (a portion represented by gray tone in the Figure) are handled in the same manner as a portion outside a portion to be a mask pattern region. Here, the width of the portion represented by gray tone in the Figure depends on the layout or the type of device.

Figure 2:
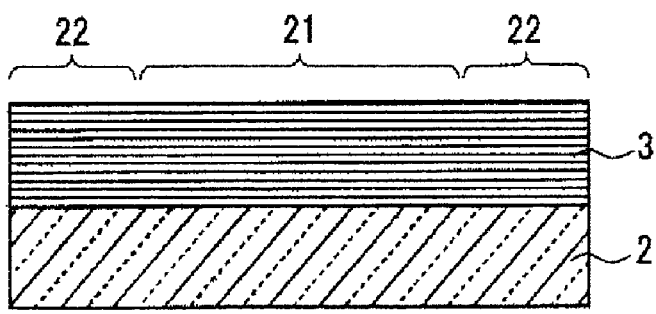
FIG. 2 is a view showing an example of a substrate with multilayer reflective film comprising a substrate and a multilayer reflective film formed on the substrate.

FIG. 2 is a view showing an example of a substrate with multilayer reflective film, wherein a multilayer reflective film 3 is formed on a substrate 2. In FIG. 2, 21 indicates a portion to be a mask pattern region in an EUV mask to be produced by employing the EUV mask blank, and 22 indicates a portion outside the portion to be a mask pattern region (a portion to be a peripheral portion of the mask pattern region).

In the process for producing an EUV mask blank of the present invention, on a surface of the multilayer reflective film 3 of the substrate with multilayer reflective film shown in FIG. 2, a portion 22 to be a peripheral portion of the mask pattern region is heated. As described above, when a surface of the multilayer reflective film is heated, the reflectivity of the surface for EUV light decreases, and accordingly, the reflectivity of the heated portion of a surface of the multilayer reflective film 3 of the substrate with multilayer reflective film after heating, that is, the portion 22 to be a peripheral portion of the mask pattern region, for EUV light becomes lower than the reflectivity of non-heated portion, that is a portion 21 to be a mask pattern region, for EUV light.

Figure 3:
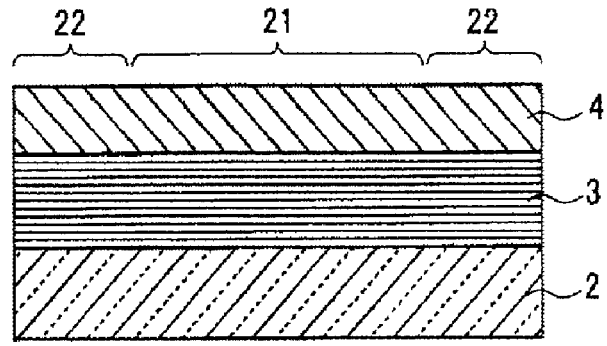
FIG. 3 is a view showing an EUV mask blank obtained by forming an absorber film on a multilayer reflective film of the substrate with multilayer reflective film shown in FIG. 2.

FIG. 3 is a view showing an EUV mask blank obtained by forming an absorber film on a multilayer reflective film of the substrate with multilayer reflective film shown in FIG. 2. As described above, in a substrate with multilayer reflective film shown in FIG. 2, the reflectivity of a portion 22 of a surface of the multilayer reflective film 3 to be a peripheral portion of a mask pattern region, for EUV light becomes lower than the reflectivity of a portion 21 to be a mask pattern region for EUV light. Accordingly, also in the EUV mask blank shown in FIG. 3, the reflectivity of a portion 22 of a surface of an absorber layer 4 to be a peripheral portion of a mask pattern region, for EUV light becomes lower. Namely, in an EUV mask blank obtained by the process of the present invention, the reflectivity of the portion 22 of a surface of the absorber layer 4 to be a peripheral portion of the mask pattern region, for EUV light becomes lower than the reflectivity of a portion 21 to be a mask pattern region, for EUV light.

Figure 4:
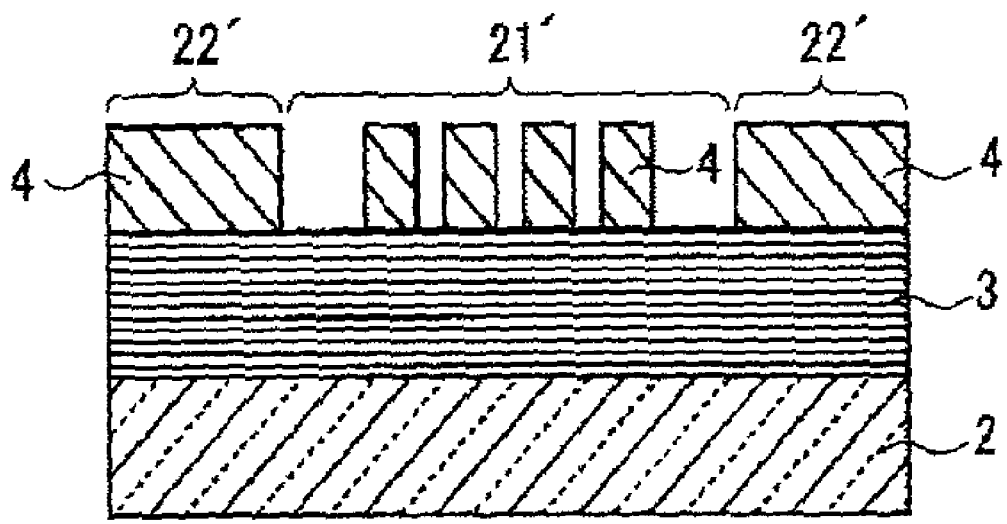
FIG. 4 is a view showing an example of an EUV mask produced by employing the EUV mask blank shown in FIG. 3.
Figure 5:
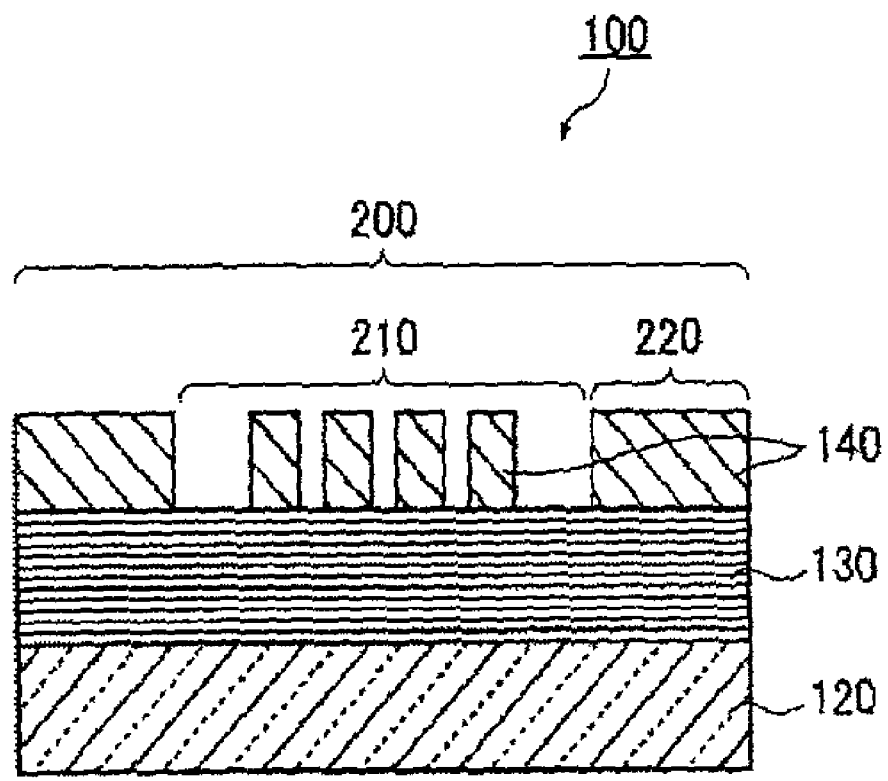
FIG. 5 is a schematic cross-sectional view showing an example of an EUV mask after a mask pattern is formed.

FIG. 4 is a view showing an Example of EUV mask produced by employing the EUV mask blank shown in FIG. 3. In the EUV mask shown in FIG. 4, a part of an absorber film 4 in a mask pattern region 21' is removed to form a mask pattern. In a case of carrying out an EUV lithography by using the EUV mask shown in FIG. 4, the reflectivity of a peripheral portion 22' of the mask pattern region on a surface of the absorber layer 4, for EUV light becomes lower than the reflectivity in the mask pattern region 21' for EUV light. Accordingly, it is possible to suppress unnecessary exposure of a resist on the substrate due to EUV reflected light from the peripheral portion 22' of the mask pattern region.

In order to achieve the above effect, in the EUV mask blank shown in FIG. 3, the maximum value of the reflectivity of a portion 22 to be a peripheral portion of the mask pattern region on a surface of the absorber film 4, for EUV light is preferably at most 1%, more preferably at most 0.8%, particularly preferably at most 0.6%. Meanwhile, the portion 21 to be a mask pattern region on a surface of the absorber film 4 is required to have a surface having a low reflectivity for EUV light in order to have a sufficiently high optical contrast of EUV reflected light in relation to the multilayer reflective film 3. However, as described above, such a requirement can be achieved by using the principle of phase shift in order to make the thickness of the absorber film 4 thinner while choosing the reflectivity of a surface of the film for EUV light so that the optical contrast of EUV light in relation to the multilayer reflective film 3 becomes sufficiently high. In order to use the principle of phase shift, the maximum value of the reflectivity of the surface for EUV light is preferably more than 1% and at most 15%, more preferably at least 5% and at most 15% (5 to 15%), further preferably at least 7% and at most 15% (7 to 15%).

Here, even in a case of not using the principle of phase shift, it is preferred that the maximum value of the reflectivity of the surface for EUV light satisfies the above range.

In order to make the maximum value of the reflectivity of the portion 22 to be a peripheral portion of the mask pattern region on the surface of the absorber film 4 of the EUV mask blank shown in FIG. 3, for EUV light and the maximum value of the reflectivity of the portion 21 to be a mask pattern region, for EUV light satisfy the above range, it is necessary that the difference of the reflectivity of the heated portion on a surface of the multilayer reflective film 3 of the substrate with multilayer reflective film shown in FIG. 2, that is, the portion 22 to be a peripheral portion of the mask pattern region, between before and after the heating, is from 10 to 60%, preferably from 15 to 50%, particularly preferably from 20 to 50%.

As described above, in a state of not heating, the maximum value of the reflectivity of a surface of the multilayer reflective film for EUV light is preferably at least 60%, more preferably at least 65%. On the surface of the multilayer reflective film 3 of the substrate with multilayer reflective film shown in FIG. 2, since the portion 21 to be a mask pattern region is not heated, the maximum value of the reflectivity of the portion for EUV light becomes within the above range. In order to make the maximum value of the reflectivity of a surface (portion 21 to be a mask pattern region) of the absorber film 4 formed on a surface of the multilayer reflective film 3 having a maximum value of the reflective for EUV light within the above range, to be more than 1% and at most 15% while the maximum value of the reflectivity of a portion 22 to be a peripheral portion of the mask pattern region to be at most 1%, it is preferred to make the difference of the reflectivity of the portion 22 to be a peripheral portion of the mask pattern region, for EUV light between before and after the heating to be from 10 to 60%.

On the surface of the multilayer reflective film 3, the difference of the reflectivity of the portion 22 to be a peripheral portion of the mask pattern region, for EUV light between before and after the heating, is preferably from 10 to 60%, more preferably from 15 to 50%, particularly preferably from 20 to 50%.

In order to make the difference of the reflectivity of the portion 22 to be a peripheral portion of the mask pattern region on the surface of the multilayer reflective film 3, for EUV light between before and after the heating to be from 10 to 60%, it is preferred to carry out a heating so that the heating temperature and the heating time satisfy the condition represented by the following formula (I).

$$\text{Reflectivity (\%) for EUV light before heating} - 9370 \times \text{heating time (min)} \times \exp(-4370/\text{heating temperature (K)}) \leq 1\% \qquad (I)$$

A heating condition satisfying the above formula (I) may, for example, be a condition that a heating is carried out at a heating temperature of 350° C. for a heating time of 10 minutes, or a heating is carried out at a heating temperature of 400° C. for a heating time of 5 minutes.

It is more preferred to carry out a heating so that the heating time and the heating temperature satisfy the condition of the following formula (II), it is further preferred to carry out the heating so as to satisfy the condition of the following formula (III).

$$\text{Reflectivity (\%) for EUV light before heating} - 9370 \times \text{heating time (min)} \times \exp(-4370/\text{heating temperature (K)}) \leq 0.8\% \qquad (II)$$

$$\text{Reflectivity (\%) for EUV light before heating} - 9370 \times \text{heating time (min)} \times \exp(-4370/\text{heating temperature (K)}) \leq 0.6\% \qquad (III)$$

Here, the environment of carrying out the heating is not particularly limited, and it may be carried out in the atmosphere air or it may be carried out in an inert gas such as a rare gas or nitrogen gas. However, in order to prevent increase of the surface roughness due to surface oxidization, the heating is preferably carried out in an inert gas such as a rare gas or nitrogen gas.

The method to be employed for heating the portion 22 to be a peripheral portion of the mask pattern region, is not particularly limited so long as it is a method capable of selectively heating only the portion 22 to be a peripheral portion of the mask pattern region on a surface of the multilayer reflective film 3.

An example of a suitable heating method may be a direct heating method of radiating a high energy light beam emitted from a light source such as a laser or a lamp to a portion 22 to be a peripheral portion of the mask pattern region from upper direction, lower direction or lateral direction to the mask pattern on a surface of the multilayer reflective film 3, to carry out the heating; or an indirect heating method of blowing a preliminary heated gas to the portion 22 to be a peripheral portion of the mask pattern region on a surface of the multilayer reflective film and using thermal conduction to carry out the heating.

In a case of radiating a light beam from a light source such as a laser or a lamp, it is necessary to select a light beam in a wavelength region that is absorbable into the materials constituting the multilayer reflective film. For example, the light source may be a laser light source such as a $F_2$ laser (wavelength about 157 nm), an ArF excimer laser (wavelength about 193 nm), a KrF excimer laser (wavelength about 248 nm), a YAG laser 4th harmonic wave (wavelength about 266 nm), a XeCl excimer laser (wavelength about 308 nm), an Ar laser (wavelength about 488 nm), a YAG laser (wavelength about 1064 nm) or a $CO_2$ laser (wavelength about 10.6 µm), or a lamp light source such as a xenon arch lamp (wavelength about 300 nm to 1000 nm) or a halogen lamp (wavelength about 600 to about 6000 nm). Further, in a case of a method of blowing a preliminary heated gas, the gas may be an inert gas such as helium gas, argon gas or nitrogen gas, or an air or hydrogen gas or a mixed gas of them, but from the viewpoint of thermal capacity and easiness of handling, the gas is preferably helium gas.

Another example of suitable heating method may be a method of bringing an exothermic member using resistance heating or induction heating, into proximity with the portion 22 to be a peripheral portion of the mask pattern region on the surface of the multilayer reflective film 3, and using radiation or thermal conduction through a gas to carry out heating. Specifically, an exothermic member using resistance heating of a filament made of e.g. tungsten or carbon, or an exothermic member using induction heating using a magnetic material such as carbon, iron or a stainless steel, may be mentioned. Further, an exothermic member other than the above may be an atomic force microscope (AFM), a scanning tunnel microscope (STM) or a probe type step meter, each of them has a heatable probe, may be mentioned, and as a commercially available product, a local thermal analysis system nano-TA manufactured by U.S. Analysis Instruments Corporation may, for example, be mentioned.

Heating of the portion 22 to be a peripheral portion of the mask pattern region is preferably carried out while avoiding lowering of reflectivity of the mask pattern region for EUV light due to heating of the mask pattern region, as much as possible. Specifically, the lowering of reflectivity of the mask pattern region for EUV light due to heating of the portion 22 to be a peripheral portion of the mask pattern region is preferably at most 0.1%, and the amount of wavelength shift is preferably at most 0.01 nm. For this reason, at the time of heating the portion 22 to be a peripheral portion of the mask pattern region, it is preferred to avoid rise of the temperature of the mask pattern region due to the heating, as much as possible.

For this purpose, in order to avoid increase in the temperature of the mask pattern region at the time of heating the portion 22 to be a peripheral portion of the mask pattern region, a method of disposing a highly thermally conductive material, for example a metal such as Al or Cu, SiC or AlN, or a thermoelectric transducer, that are cooled to room temperature or lower (for example, at most 10° C.) or that has an adjusted temperature, at a position above the mask pattern region, specifically, a position about from 1 to 10 mm above the mask pattern region; or a method of blowing a gas (such as helium or hydrogen) that is cooled to room temperature or lower (for example, at most 10° C.) or that has an adjusted temperature, to a mask pattern region; may be employed.

Further, as the heating method, among the above-mentioned methods, a method of radiating a high energy light beam or an electron beam to carry out heating is preferred from the viewpoint of capability of heating only an intended portion within a short time. Here, in the case of radiating the above light beam or electron beam, the radiation may be made from any direction such as from the upper side, from the downside or from an oblique direction onto the substrate, but radiation from the upper side is preferred since it is simple and there is no need of considering absorption into the substrate.

After the heating, it is preferred to measure the reflectivity of the portion 22 of the surface of the multilayer reflective film 3 to be a peripheral portion of the mask pattern region, for EUV light to confirm that the maximum value of the reflectivity of the portion 22 for EUV light has been decreased to be a desired range, before forming an absorber film on the multilayer reflective film 3. If the reflectivity of the portion 22 for EUV light has not been decreased to the desired range, the portion 22 may be further heated to decrease the reflectivity of the portion 22 for EUV light to be within the desired range.

Here, the method of radiating a high energy light beam or an electron beam to carry out heating is effective in that the portion 22 to be a peripheral portion of the mask pattern region can be heated even after forming the absorber film or an antireflective film. In this case, as the high energy light beam, a light beam in a wavelength region in which the absorber film surface or the antireflective film surface has a low reflectivity, may be employed. Specifically, for example, a light beam having a wavelength close to 257 nm to be used as mask pattern inspection light, KrF excimer laser light of 248 nm or YAG laser 4th harmonic wave (wavelength about 266 nm) may be employed. Further, along with miniaturization of mask pattern, use of light having shorter wavelength is considered as mask pattern inspection light, and light having a wavelength of 199 nm or a wavelength of 193 nm may be used for the inspection. In this case, ArF excimer laser light having a wavelength of 193 nm may be used.

Here, as a method different from that of the present invention, a method of reducing the number of repeating units in the multilayer reflective film in the portion 22 to be a peripheral portion of the mask pattern region can lower the reflectivity of the portion 22 to be a peripheral portion of the mask pattern region, for EUV light. Specifically, by making the number of repeating units in the multilayer reflective film in the portion 21 to be a mask pattern region, to be from 30 to 60, while the number of repeating units of the multilayer reflective film in the portion 22 to be a peripheral portion of the mask pattern region, to be at most 10 layers, whereby an EUV mask can be obtained, wherein the reflectivity of a portion outside a portion to be a mask pattern region, for EUV light is at most 1% and the reflectivity of a portion to be a mask pattern region, for EUV light is more than 1% and at most 15%.

[Absorber Film]

The characteristic particularly required to the absorber film 4 is a sufficiently high optical contrast of EUV reflected light in relation to the multilayer reflective film 3 (a protection film when the protection film is formed on the multilayer reflective film 3). In order to achieve the above characteristic, it is preferred that the reflectivity of a surface of the absorber film 4 for EUV light is extremely low. However, since the thickness of the absorber film 4 is required to be thin, it is not realistic to sufficiently increase the optical contrast of EUV reflected light simply by lowering the reflectivity of a surface of the absorber film 4 for EUV light. For this reason, it is preferred to sufficiently increase the optical contrast of EUV reflected light by using the principle of phase shift in relation to reflected light from the multilayer reflective film 3.

In order to use the principle of phase shift in relation to reflected light from the multilayer reflective film 3, the phase of EUV reflected light from the absorber film 4 is preferably different from the phase of EUV reflected light from the multilayer reflective film 3 by from 175 to 185°.

Further, in order to sufficiently increase the optical contrast of EUV reflected light, it is preferred that the phase difference between EUV reflected light from the absorber film 4 and EUV reflected light from the multilayer reflective film 3 is preferably from 175 to 185°, more preferably from 177 to 183°.

As described above, in order to use the principle of phase shift, the maximum value of the reflectivity of a portion 21 of a surface of the absorber film 4 to be a mask pattern region, for EUV light is preferably from 5 to 15%, more preferably from 6 to 15%, further preferably from 7 to 15%.

Meanwhile, with respect to a portion 22 of a surface of the absorber film 4 to be a peripheral portion of the mask pattern region, since the reflectivity of the multilayer reflective film 3 underneath the absorber film 4 for EUV light has been decreased by heating, the maximum value of the reflectivity of the portion 22 for EUV light is preferably at most 1%, more preferably at most 0.8%, particularly preferably at most 0.6%.

In order to achieve the above characteristic, the absorber film 4 is made of a material having a high absorption coefficient of EUV light. As the material having a high absorption coefficient of EUV light, a material containing tantalum (Ta) as the main component is preferred. In this specification, a material containing tantalum (Ta) as the main component means a material containing Ta in an amount of at most 40 at % (atomic composition ratio) in the material. The absorber film 4 contains tantalum (Ta) in an amount of preferably at least 50 at %, more preferably at least 55 at %.

The material containing Ta as the main component to be used for the absorber film 4 contains besides Ta at least one component selected from the group consisting of hafnium (Hf), silicon (Si), zirconium (Zr), germanium (Ge), boron (B), hydrogen (H) and nitrogen (N). A specific example of the material containing the above element other than Ta may, for example, be TaN, TaNH, TaHf, TaHfN, TaBSi, TaBSiN, TaB, TaBN, TaSi, TaSiN, TaGe, TaGeN, TaZr or TaZrN.

Here, the absorber film 4 preferably contains no oxygen (O). Specifically, the content of O in the absorber film 4 is preferably less than 25 at %. At a time of forming a mask pattern in the absorber film of an EUV mask blank to produce an EUV mask, a dry etching process is usually used, and as an etching gas, a chlorine type gas (or a mixed gas containing a chlorine type gas) or a fluorine type gas (or a mixed gas containing a fluorine type gas) is usually used. When a film containing Ru or a Ru compound is formed as a protection film on the multilayer reflective film for the purpose of preventing a damage of the multilayer reflective film by the etching process, a chlorine type gas is mainly used as the etching gas since the damage of the protection film is small. However, if the absorber film 4 contains oxygen at a time of carrying out a dry etching process by using a chlorine type gas, the etching rate decreases, and the resist damage increases, such being not preferred. The content of oxygen in the absorber film 4 is preferably at most 15 at %, particularly preferably at most 10 at %, further preferably at most 5 at %.

The thickness of the absorber film 4 is preferably selected so that the phase difference between EUV reflected light from the absorber film 4 and EUV reflected light from the multilayer reflective film 3 becomes from 175 to 185° and that the thickness is from 10 to 60 nm. Further, the thickness of the absorber film 4 is more preferably from 15 to 40 nm.

The absorber film 4 having the above construction may be formed by carrying out a known film-forming method such as a magnetron sputtering method or an ion beam sputtering method.

For example, in a case of forming a TaHf film by using a magnetron sputtering method as the absorber film 4, the film can be formed under the following conditions.

Sputtering target: TaHf compound target (Ta=30 to 70 at %, Hf=70 to 30 at %)

Sputtering gas: an inert gas such as Ar gas (gas pressure $1.0 \times 10^{-1}$ Pa to $50 \times 10^{-1}$ Pa, preferably $1.0 \times 10^{-1}$ Pa to $40 \times 10^{-1}$ Pa, more preferably $1.0 \times 10^{-1}$ Pa to $30 \times 10^{-1}$ Pa)

Degree of vacuum before film-forming: at most $1 \times 10^{-4}$ Pa, preferably at most $1 \times 10^{-5}$ Pa, more preferably at most $10^{-6}$ Pa Input power: 30 to 1,000 W, preferably 50 to 750 W, more preferably 80 to 500 W Film-forming speed: 2.0 to 60 nm/min, preferably 3.5 to 45 nm/min, more preferably 5 to 30 nm/min

[Buffer Film]

In order to prevent the multilayer reflective film 3 from being damaged by an etching process carried out at a time of forming a mask pattern in the absorber film 4 of the EUV mask blank to produce an EUV mask, a buffer film having as an etching stopper maybe provided between the multilayer reflective film 3 (a protective film when the protection film is formed on the multilayer reflective film) and the absorber film 4.

As the material of such a buffer film, a material not susceptible to the etching process of the absorber film 4, that is, a material having an etching rate lower than that of the absorber film 4 and not being susceptible to this etching process, may be employed. A material satisfying this condition may, for example, be Cr, Al, Ru, Ta or a nitride of any of them, or $SiO_2$, $Si_3N_4$, $Al_2O_3$ or a mixture of them, may be mentioned. Among these, the material is preferably Ru, CrN or $SiO_2$, more preferably CrN or Ru, particularly preferably Ru from the viewpoint of having functions of both protection film and buffer film.

The thickness of the buffer film is preferably from 1 to 60 nm, particularly preferably from 1 to 10 nm, further preferably from 1 to 5 nm.

The buffer film is formed by using a known film-forming method such as a magnetron sputtering method or an ion beam sputtering method. In a case of forming a Ru film by a magnetron sputtering method, the film-forming is preferably carried out using a Ru target as a target and Ar gas (gas pressure $1.0 \times 10^{-1}$ to $10 \times 10^{-1}$ Pa, preferably $2 \times 10^{-1}$ to $7 \times 10^{-1}$ Pa) as a sputtering gas under an input power of from 30 to 500 W, preferably from 50 to 400 W at a film-forming speed of from 5 to 50 nm/min, preferably from 10 to 35 nm/min to have a film thickness of from 2 to 5 nm, preferably from 2.5 to 4.5 nm.

[Antireflective Film]

In the process for producing a mask blank of the present invention, an antireflective film may be formed on the absorber film 4 to improve the optical contrast at a time of inspecting a mask pattern.

At the time of forming a mask pattern in the absorber film of the EUV mask blank to produce an EUV mask, an inspection is carried out to check whether the mask pattern is formed as designed. In this inspection of mask pattern, an inspection machine using inspection light having a wavelength of about 257 nm (KrF excimer laser light having a wavelength of 248 nm or YAG laser 4th harmonic wave (wavelength about 266 nm)) is usually employed. Namely, the inspection is carried out by an optical contrast of reflected light in a wavelength region of about 257 nm.

The absorber film of the EUV mask blank of the present invention has an extremely low reflectivity for EUV light and has an excellent characteristic of an absorber film of EUV mask blank. However, the absorber film does not have a sufficiently low reflectivity in the wavelength region of inspection light, and a sufficient optical contrast may not be obtained at a time of inspecting a mask pattern. If a sufficient optical contrast is not obtained, it is not possible to properly judge defects at the time of mask pattern inspection, and as a result, an accurate defect inspection cannot be carried out.

When the antireflective film is formed on the absorber film, the reflectivity of a surface of the antireflective film for mask pattern inspection light becomes extremely low, and the optical contrast at a time of mask pattern inspection improves. Specifically, the reflectivity of the antireflective film surface for the mask pattern inspection light is preferably at most 15%, more preferably at most 10%, further preferably at most 5%.

The antireflective film is preferably constituted by a material having a refractive index for the inspection light lower than that of the absorber film in order to achieve the above characteristic.

The antireflective film is preferably made of a material containing tantalum (Ta) as the main component. The material containing Ta as the main component, that is to be employed for the antireflective film, contains other than Ta at least one component selected from the group consisting hafnium (Hf), germanium (Ge), silicon (Si), boron (B), nitrogen (N), hydrogen (H) and oxygen (O).

A specific example of the material containing the above element other than Ta may, for example, be TaO, TaON, TaONH, TaHfO, TaHfON, TaBSiO or TaBSiON.

In a case of forming the antireflective film on the absorber film, the total thickness of the absorber film and the antireflective film is preferably from 10 to 65 nm, more preferably from 30 to 65 nm, further preferably from 35 to 60 nm. Further, if the thickness of the antireflective film is thicker than the thickness of the absorber film, the EUV light-absorbing characteristic of the absorber film may decrease. Accordingly, the thickness of the antireflective film is preferably thinner than the thickness of the absorber film. For this reason, the thickness of the antireflective film is preferably from 1 to 20 nm, more preferably from 3 to 15 nm, further preferably from 5 to 10 nm.

In the process for producing an EUV mask blank of the present invention, a known functional film in the field of EUV mask blank may be provided in the EUV mask blank besides the multilayer reflective film, the protection film, the buffer film, the absorber film and the antireflective film. An example of such a functional film may, for example, be a high dielectric coating to be provided on a rear side (from film-forming surface) of the substrate in order to facilitate electrostatic chucking of the substrate as described in JP-A-2003-501823. The electric conductivity and the thickness of the material of such a high dielectric coating to be provided on a rear surface of the substrate for such a purpose, are selected so that the sheet resistance becomes at most $100\Omega/\square$.

The material of the high dielectric coating may be selected from the wide range of materials described in known documents. For example, the high dielectric coating described in JP-A-2003-501823, specifically, a coating of silicon, titanium nitride, molybdenum, chromium or tantalum silicide may be applied. The thickness of such a high dielectric coating may, for example, be from 10 to 1,000 nm.

The high dielectric coating may be formed by using a known film-forming method, for example, a sputtering method such as a magnetron sputtering method or an ion beam sputtering method, a CVD method, a vacuum vapor deposition method or an electrolytic method.

An EUV mask can be obtained by forming a desired mask pattern in the absorber film of the EUV mask blank obtained by the above process by using a photolithography process. The EUV mask of the present invention can be applied to a process for producing a semiconductor integrated circuit using a photolithography process using EUV light as a light source for exposure. Specifically, a substrate such as a silicon wafer coated with a resist is disposed on a stage, the EUV mask of the present invention is disposed on a catoptric type exposure apparatus constituted by a combination of reflective mirrors. Then, EUV light is emitted from a light source and incident into the EUV mask via the reflective mirrors, and the EUV light is reflected by the EUV mask and incident into the substrate coated with a resist. By this transferring step, a circuit pattern is transferred onto the substrate. The substrate on which the circuit pattern is transferred is subjected to a developing process to etch an exposed portion or a non-exposed portion, and the resist is removed. The semiconductor integrated circuit is produced by repeating such a step.

EXAMPLES

Now, the present invention will be described in further detail with reference to Examples. However, the present invention should not be construed as limited to these Examples.

Example 1

As a substrate for film-forming, a $SiO_2$—$TiO_2$ type glass substrate (external shape is about 6 inch (about 152 mm) square, the thickness is about 6.35 mm) is employed. The glass substrate has a thermal expansion coefficient of $0.2\times10^{-7}/°C.$, a Young's modulus of 67 GPa, a Poisson's ratio of 0.17 and a specific rigidity of $3.07\times10^7$ $m^2/s^2$. By polishing the glass substrate to have a smooth surface having a surface roughness (rms) of at most 0.15 nm and a flatness of at most 100 nm.

By forming a CrN film having a thickness of 100 nm on a rear surface of the substrate by using a magnetron sputtering method, an electrically conductive film having a sheet resistance of $70\Omega/\square$ is provided.

On a common electrostatic chuck having a flat plate shape, the substrate is fixed via the formed CrN film, and alternate formation of a Si film and a Mo film on a surface of the substrate by using an ion beam sputtering method is repeated 50 cycles to form a Si/Mo multilayer reflective film (hereinafter it may be referred to as reflective layer).

Further, on the Si/Mo multilayer reflective film (reflective layer), a Ru film (thickness 2.5 nm) is formed by using an ion beam sputtering method to form a buffer film.

Film forming conditions of the CrN film, Si film, Mo film and Ru film are as follows.
Film-Forming Conditions of CrN Film
  Target: Cr target
  Sputtering gas: mixed gas of Ar and $N_2$ (Ar: 70 vol %, $N_2$: 30 vol %, gas pressure: 0.3 Pa)
  Input power: 150 W
  Film-forming speed: 0.11 nm/sec
  Film thickness: 100 nm
Film-Forming Conditions of Si Film
  Target: Si target (boron-doped)
  Sputtering gas: Ar gas (gas pressure 0.02 Pa)
  Voltage: 700 V
  Film-forming speed: 0.077 nm/sec
  Film thickness: 4.5 nm
Film-Forming Conditions of Mo Film
  Target: Mo target
  Sputtering gas: Ar gas (gas pressure 0.02 Pa)
  Voltage: 700 V
  Film-forming speed: 0.064 nm/sec
  Film thickness: 2.3 nm
Film-Forming Conditions of Buffer Film (Ru Film)
  Target: Ru target
  Sputtering gas: Ar gas (gas pressure 0.02 Pa)
  Voltage: 500 V
  Film-forming speed: 0.023 nm/sec
  Film thickness: 2.5 nm Subsequently, an absorber film (hereinafter it may also be referred to as absorber layer) (TaNH film) containing Ta, N and H on the buffer film by using a magnetron sputtering method.

The composition ratio (at %) of the absorber layer is Ta:N:H=58:39:3.

The film-forming conditions of the absorber film (absorber layer) are as follows.
Film-Forming Conditions of Absorber Film (Absorber Layer (TaNH Film))
  Target: Ta target
  Sputtering gas: mixed gas of Ar, $N_2$ and $H_2$ (Ar: 89 vol %, $N_2$: 8.3 vol %, $H_2$: 2.7 vol %, gas pressure: 0.46 Pa)
  Input power: 300 W
  Film-forming speed: 1.5 nm/min
  Film thickness: 51 nm On the absorber layer, an antireflective film (hereinafter it may also be referred to as low reflective layer) for inspection light having a wavelength of 257 nm, containing Ta, N and O, is formed by using a magnetron sputtering method to obtain an EUV mask blank. The composition ratio (at %) of the low reflective layer is Ta:N:O=22.1:4.4:73.5.

The film forming conditions of the antireflective film (low reflective layer (TaON film)) are as follows.

Film-Forming Conditions of Antireflective Film (Low Reflective Layer (TaON Film))

Figure 7:
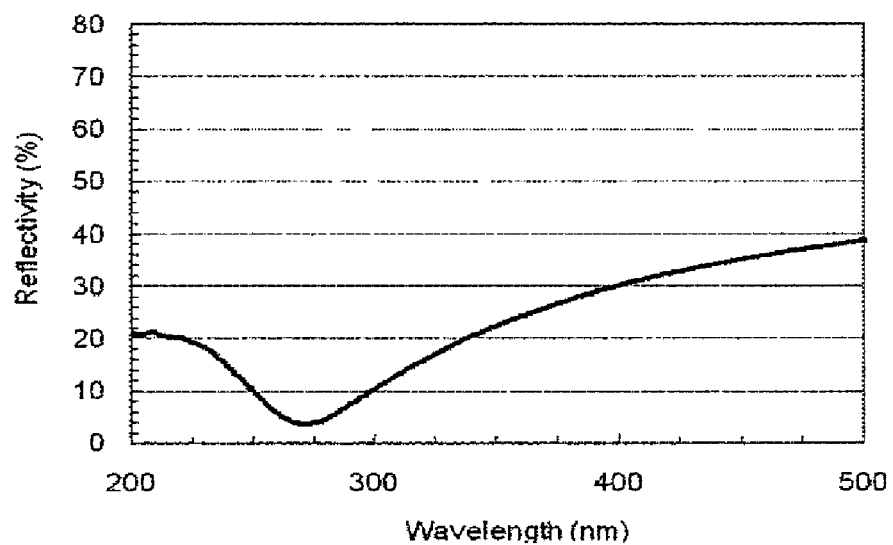
FIG. 7 is a graph showing the reflectivity of an EUV mask blank before laser beam exposure formed in Example 1 and Comparative Example 1.

Target: Ta target
Sputtering gas: mixed gas of Ar, $N_2$ and $O_2$ (Ar: 36 vol %, $N_2$: 14 vol %, $O_2$: 50 vol %, gas pressure: 0.3 Pa)
Input power: 450 W
Film-forming speed: 0.28 nm/min
Film thickness: 10 nm FIG. 7 shows the reflective spectrum of a produced EUV mask blank in a wavelength region of from 200 to 500 nm. The EUV mask blank has a low reflectivity in the vicinity of wavelength 260 nm, and is suitable for mask pattern inspection using light having a wavelength of 257 nm. Further, KrF excimer laser light having a wavelength of 248 nm (energy density 10 mJ/cm$^2$/pulse, frequency 100 Hz) is radiated from the upper side of the multilayer reflective film to the peripheral portion of the EUV mask blank (portion corresponding to the portion 22 in FIG. 2 or 3) for 10 minutes. Namely, only the portion 22 to be a peripheral portion is locally heated. The peak reflectivity of the above portion 22 at wavelength of from 13 to 14 nm (reflectivity for EUV light) under an incident angle of 6° (angle from a normal line to the mask blank) is measured. The peak reflectivity is 0.8%.

Comparative Example 1

An EUV mask blank is formed in the same manner as Example 1. Without carrying out radiation of laser of Example 1, the peak reflectivity (reflectivity for EUV light) is measured in the same manner as Example 1. The peak reflectivity of the portion 22 is 2.2%.

INDUSTRIAL APPLICABILITY

The reflective mask for EUV lithography produced by employing the reflective mask blank for EUV (extreme ultraviolet) lithography of the present invention, is excellent in the shape accuracy or dimension accuracy of a transfer pattern to be formed in a resist on a substrate by employing the EUV mask. Accordingly the mask is applicable to production processes for semiconductor integrated circuits having fine patterns by using a photolithography method employing EUV light as exposure light source.

The entire disclosure of Japanese Patent Application No. 2008-227909 filed on Sep. 5, 2008 including specification, claims, drawings and summary is incorporated herein by reference in its entirety.

EXPLANATION OF NUMERALS

2: Substrate
3: Multilayer reflective film
4: Absorber film
21: Portion of EUV mask to be mask pattern region
22: Portion of EUV mask outside a portion to be mask pattern region (portion of EUV mask to be peripheral portion of mask pattern region)
100: EUV mask
120: Substrate
130: Multilayer reflective film
140: Absorber film
200: Real exposure region
210: Mask pattern region
220: Peripheral portion of mask pattern region
300: Mask pattern (device)

What is claimed is:

1. A process for producing a reflective mask blank for EUV lithography (EUVL), comprising alternately laminating a high refractive index film and a low refractive index film on a substrate to form a multilayer reflective film for reflecting EUV light and forming an absorber layer for absorbing EUV light on the multilayer reflective film,
wherein the process further comprises after formation of the above multilayer reflective film, heating a portion of a surface of the multilayer reflective film outside a portion to be a mask pattern region in a reflective mask for EUV lithography produced by employing the reflective mask blank for EUV, to reduce the reflectivity of the heated portion of the surface of the multilayer reflective film for EUV light
wherein the difference of the reflectivity of the heated portion of the surface of the multilayer reflective film for EUV light between before and after the heating is from 10 to 60%.

2. The process for producing a reflective mask blank for EUVL according to claim 1, wherein the reflectivity for EUV light before the heating is at least 60%.

3. The process for producing a reflective mask blank for EUVL according to claim 1, which employs radiation of a light beam or an electron beam for the heating.

4. The process for producing a reflective mask blank for EUVL according to claim 1, which employs an exothermic member for the heating.

5. The process for producing a reflective mask blank for EUVL according to claim 1, which employs blowing of a preliminarily heated gas for the heating.

6. The process for producing a reflective mask blank for EUVL according to claim 1, which further comprises a step of forming on the absorber film an antireflective film for improving the optical contrast at a time of inspecting a mask pattern.

7. The process for producing a reflective mask blank for EUVL according to claim 1, which further comprises measuring the reflectivity of a portion of the mask blank outside the mask pattern region for EUV light to confirm that the maximum value of the reflectivity of the portion for EUV light has decreased to be within a desired range before forming the absorbing film.

8. A reflective mask blank for EUVL which is produced by the process according to claim 1.

9. The reflective mask blank for EUVL according to claim 8, wherein the phase of EUV reflected light from a surface of the absorber film is different from the phase of EUV reflected light from a surface of the multilayer reflective film by from 175 to 185°.

10. The reflective mask blank for EUVL according to claim 8, wherein the reflectivity of a portion of a surface of the absorber film outside a portion to be a mask pattern region in a reflective mask for EUV lithography to be produced by employing the reflective mask blank for EUVL, for EUV light is at most 1%, and the reflectivity of a portion to be a mask pattern region for EUV light is more than 1% and at most 15%.

11. A reflective mask for EUV lithography (EUVL) produced by forming a mask pattern in the absorber film of the reflective mask blank for EUVL as defined in claim 8.

12. A process for producing a semiconductor integrated circuit comprising carrying out an exposure to an object to be exposed by using the reflective mask for EUVL as defined in claim 11.

13. A process for producing a reflective mask blank for EUV lithography (EUVL), comprising alternately laminating a high refractive index film and a low refractive index film on a substrate to form a multilayer reflective film for reflecting EUV light and forming an absorber layer for absorbing EUV light on the multilayer reflective film, wherein the process further comprises after formation of the above multilayer reflective film, heating a portion of a surface of the multilayer reflective film outside a portion to be a mask pattern region in a reflective mask for EUV lithography produced by employing the reflective mask blank for EUV, to reduce the reflectivity of the heated portion of the surface of the multilayer reflective film for EUV light, wherein the difference of the reflectivity of the heated portion of the surface of the multilayer reflective film for EUV light between before and after the heating is from 10 to 60% and the heating is carried out under the condition satisfying the following formula:

Reflectivity (%) for EUV light before heating−9370× heating time (min)×exp (−4370/heating temperature (K))≦1%.

14. A process for producing a reflective mask blank for EUV lithography (EUVL) comprising alternately laminating on a substrate at least a high refractive index film and a low refractive index film to form a multilayer reflective film reflecting EUV light, forming a protection film on the multilayer reflective film, and forming an absorber film for absorbing EUV light on the protection film, wherein the process further comprises after formation of the protection film a step of heating a portion of the protection film outside a portion to be a mask pattern region in a reflective mask for EUV lithography produced by employing the reflective mask blank for EUVL, to reduce the reflectivity of the heated portion of the surface of the protection film for EUV light wherein the difference of the reflectivity of the heated portion of the surface of the protection film for EUV light between before and after the heating is from 10 to 60%.

15. The process for producing a reflective mask blank for EUVL according to claim 14, wherein the reflectivity for EUV light before the heating is at least 60%.

16. A process for producing a reflective mask blank for EUV lithography (EUVL) comprising alternately laminating on a substrate at least a high refractive index film and a low refractive index film to form a multilayer reflective film reflecting EUV light, forming a protection film on the multilayer reflective film, and forming an absorber film for absorbing EUV light on the protection film, wherein the process further comprises after formation of the protection film a step of heating a portion of the protection film outside a portion to be a mask pattern region in a reflective mask for EUV lithography produced by employing the reflective mask blank for EUVL, to reduce the reflectivity of the heated portion of the surface of the protection film for EUV light, wherein the difference of the reflectivity of the heated portion of the surface of the protection film for EUV light between before and after the heating is from 10 to 60% and the heating is carried out under the condition satisfying the following formula:

Reflectivity (%) for EUV light before heating−9370× heating time (min)×exp (−4370/heating temperature (K))≦1%.

17. The process for producing a reflective mask blank for EUVL according to claim 14, which employs radiation of a light beam or an electron beam for the heating.

18. The process for producing a reflective mask blank for EUVL according to claim 14, which employs an exothermic member for the heating.

19. The process for producing a reflective mask blank for EUVL according to claim 14, which employs blowing of a preliminarily heated gas for the heating.

20. The process for producing a reflective mask blank for EUVL according to claim 14, which further comprises a step of forming on the absorber film an antireflective film for improving the optical contrast at a time of inspecting a mask pattern.

21. The process for producing a reflective mask blank for EUVL according to claim 14, which further comprises measuring the reflectivity of a portion of the mask blank outside the mask pattern region for EUV light to confirm that the maximum value of the reflectivity of the portion for EUV light has decreased to be within a desired range before forming the absorbing film.

22. A reflective mask blank for EUVL which is produced by the process according to claim 14.

23. The reflective mask blank for EUVL according to claim 22, wherein the phase of EUV reflected light from a surface of the absorber film is different from the phase of EUV reflected light from a surface of the protection film by from 175 to 185°.

24. The reflective mask blank for EUVL according to claim 22, wherein the reflectivity of a portion of a surface of the absorber film outside a portion to be a mask pattern region in a reflective mask for EUV lithography to be produced by employing the reflective mask blank for EUVL, for EUV light is at most 1%, and the reflectivity of a portion to be a mask pattern region for EUV light is more than 1% and at most 15%.

* * * * *